(12) United States Patent
Gong et al.

(10) Patent No.: US 7,218,261 B2
(45) Date of Patent: May 15, 2007

(54) METHOD OF ADJUSTING SAMPLING CONDITION OF ANALOG TO DIGITAL CONVERTER AND APPARATUS THEREOF

(75) Inventors: Jin-Sheng Gong, Tao-Yuan Hsien (TW); Yu-Pin Kuo, Tai-Chung (TW); Yu-Pin Chou, Maio-Li Hsien (TW); Hung-Jen Chu, Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/306,638

(22) Filed: Jan. 5, 2006

(65) Prior Publication Data

US 2006/0197692 A1    Sep. 7, 2006

(30) Foreign Application Priority Data

Jan. 7, 2005    (TW) .............................. 94100504 A

(51) Int. Cl.
*H03M 1/00*    (2006.01)

(52) U.S. Cl. ........................ 341/123; 345/213; 348/537

(58) Field of Classification Search ................ 345/100, 345/99, 213, 204, 98, 690; 348/793, 536, 348/537, 790; 341/123
See application file for complete search history.

(56) References Cited

U.S. PATENT DOCUMENTS

| 4,581,654 | A  | * | 4/1986  | Kobayashi et al. ......... 348/790 |
| 5,365,284 | A  | * | 11/1994 | Matsumoto et al. ........ 348/793 |
| 5,936,678 | A  | * | 8/1999  | Hirashima .................. 348/537 |
| 6,268,848 | B1 |   | 7/2001  | Eglit |
| 6,337,682 | B1 | * | 1/2002  | Hwang ....................... 345/213 |
| 6,700,570 | B2 | * | 3/2004  | Tachibana et al. .......... 345/213 |

* cited by examiner

*Primary Examiner*—Jean Bruner Jeanglaude
(74) *Attorney, Agent, or Firm*—Winston Hsu

(57) ABSTRACT

A method of adjusting a sampling condition to generate a sampling clock in an analog to digital converter includes performing an analog to digital conversion on an analog input signal to thereby produce a digital sampled signal having a plurality of samples; calculating a difference value between two adjacent samples in the digital sampled signal; comparing the difference value with a threshold; adding the difference value into a sum of differences value if the difference value is greater than the threshold; and generating the sampling clock for the analog to digital converter according to the sum of differences value.

22 Claims, 4 Drawing Sheets

METHOD OF ADJUSTING SAMPLING CONDITION OF ANALOG TO DIGITAL CONVERTER AND APPARATUS THEREOF

BACKGROUND OF THE INVENTION

1. Field of the Invention

The invention relates to analog-to-digital converters, and more particularly, to adjusting a sampling condition of an analog-to-digital converter.

2. Description of the Prior Art

Choosing a sampling condition for an analog to digital converter (ADC) is a very important operation and generally speaking includes, but is not limited to, adjusting the phase and/or the frequency of a sampling clock for the ADC. There are a wide variety of applications that require methods for adjusting the sampling condition of an ADC. For example, in a liquid crystal display (LCD), a received analog input signal is normally coupled to an ADC to convert the received analog input signal into a digital sampled signal. However, reductions in sampling quality will likely result due to a non-optimal ADC sampling condition. Because of this, LCDs normally also include an automatic phase setting function and/or an automatic clock setting function to automatically adjust the sampling condition of the ADC.

Taking the automatic phase setting function as an example, the sampling condition for the ADC is formed according to different sampling phases. In this way, the ADC converts an analog signal into a digital signal utilizing different sampling phases, and calculates a characteristic value for the digital signals obtained for each of the different sampling phases according to a particular algorithm. For example, a sum of differences (SOD) value can be calculated for the digital signal according to a particular algorithm. By means of comparing the calculated characteristic values, a preferred sampling phase can be chosen. Afterwards the ADC performs sampling operations according to the preferred sampling phase.

However, the sampling condition adjusting method according to the SOD value does not necessarily provide adequate information to choose an optimal sampling condition. For example, if the range of change of the input signal is very small for most of the time that each SOD value is being calculated, the difference between different SOD values obtained for the different sampling conditions will not be significant, and this results in difficulty choosing which is the optimal sampling condition.

SUMMARY OF THE INVENTION

One objective of the present invention is therefore to provide a method and apparatus to adjust the sampling condition of an analog-to-digital converter.

According to an exemplary embodiment of the claimed invention, a display controller is disclosed comprising an analog to digital converter module for receiving an analog input signal and generating a digital sampled signal having a plurality of samples according to a sampling clock; a calculating module coupled to the analog to digital converter module for comparing a difference value between two adjacent samples in the digital sampled signal with a first threshold, and when the difference value is greater than the threshold, adding the difference value to a sum of differences value; and a sampling clock generator module coupled to the analog to digital converter module and the calculating module for generating the sampling clock according to the sum of differences value calculated by the calculating module.

According to another exemplary embodiment of the claimed invention, an analog to digital converter is disclosed comprising an analog to digital converter module for receiving an analog input signal and generating a digital sampled signal having a plurality of samples according to a sampling clock; a calculating module coupled to the analog to digital converter module for comparing a difference value between two adjacent samples in the digital sampled signal with a first threshold, and when the difference value is greater than the threshold, adding the difference value to a sum of differences value; and a sampling clock generator module coupled to the analog to digital converter module and the calculating module for generating the sampling clock according to the sum of differences value calculated by the calculating module.

According to another exemplary embodiment of the claimed invention, a method is disclosed for adjusting a sampling condition to generate a sampling clock in an analog to digital converter. The method comprises performing an analog to digital conversion on an analog input signal to thereby produce a digital sampled signal having a plurality of samples; calculating a difference value between two adjacent samples in the digital sampled signal; comparing the difference value with a threshold; adding the difference value into a sum of differences value if the difference value is greater than the threshold; and generating the sampling clock for the analog to digital converter according to the sum of differences value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
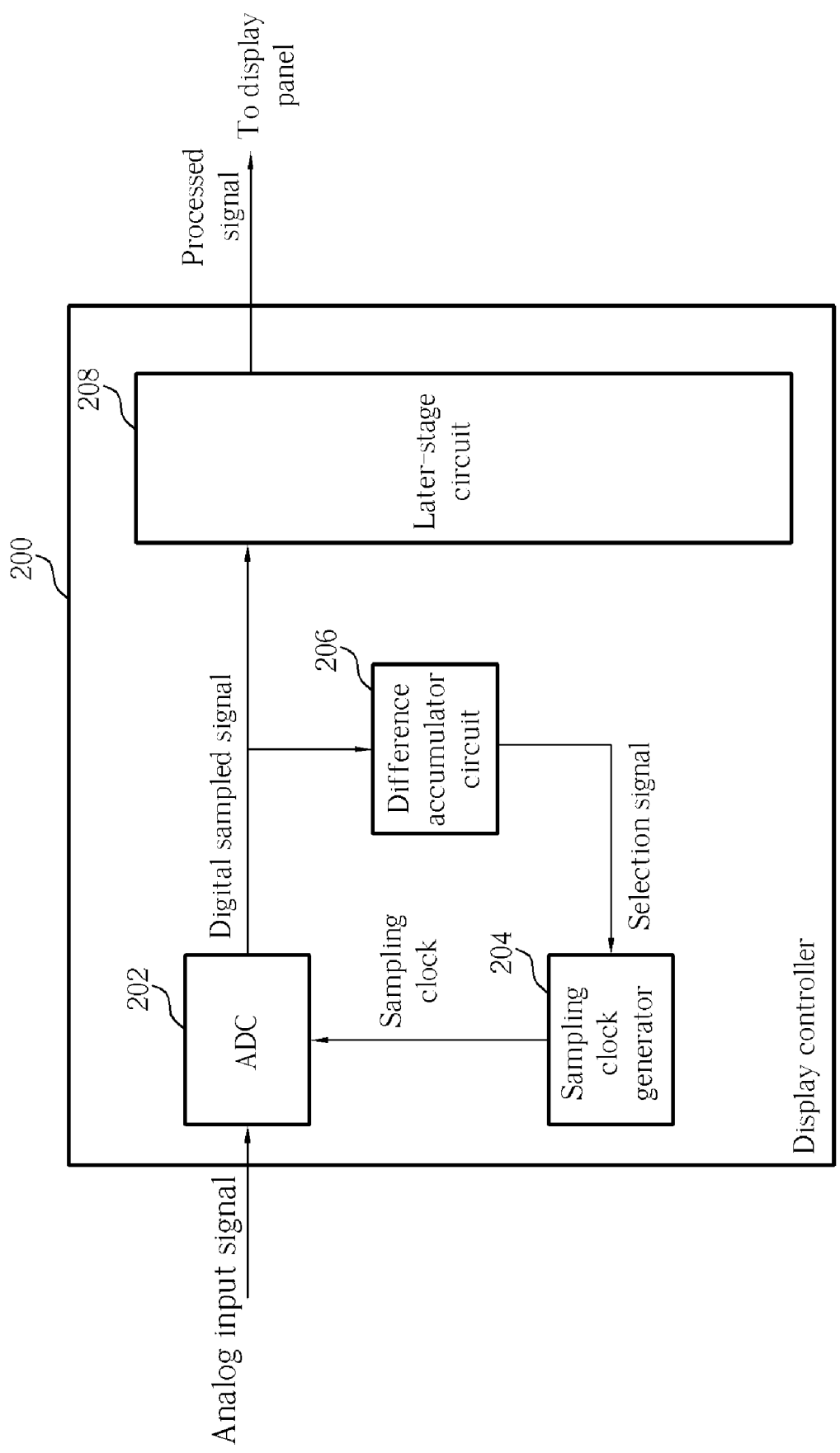
FIG. 1 shows a block diagram of a display controller according to an exemplary embodiment of the present invention.

FIG. 1 shows a block diagram of a display controller 200 according to an exemplary embodiment of the present invention. As will be readily apparent to a person of ordinary skill in the art, the display controller 200 could be utilized in a liquid crystal display (LCD) monitor controller, an LCD television (TV) controller, or a digital TV controller; however the present invention is not meant to be limited to only these applications. The display controller 200 includes an analog-to-digital converter (ADC) 202 for sampling a received analog signal according to a sampling clock to thereby generate a digital sampled signal for use by a later-stage circuit 208 for performing subsequent image processing, a sampling clock generator 204 for generating the sampling clock utilized by the ADC 202 when performing sampling operations, and a difference accumulator circuit 206 for using a particular algorithm to calculate a sum of differences (SOD) value corresponding to a set of samples in the digital sampled signal generated by the ADC 202. The SOD value is then utilized to produce a selection signal for controlling the sampling clock generator 204 to select an optimal sampling phase. In this embodiment, the sampling clock generator 204 is capable of generating a plurality of different sampling clocks corresponding to different sampling conditions (e.g., each sampling clock having a different sampling phase). It should also be noted that the later-stage circuit 208 in this embodiment is utilized to perform display control operations widely known in the display art, such as interpolation, scaling, etc. That is, the later-stage circuit 208 is utilized to generate a signal for driving a display panel, and as this is well-known material to those skilled in the art, further description of the later-stage circuit 208 is omitted herein.

In this embodiment, the display controller 200 first operates in an adjusting mode to compare SOD values calculated by the difference accumulator circuit 206 for the different sampling conditions, and to then choose the sampling clock corresponding to one of the sampling conditions (e.g., having a particular sampling phase) as the normal sampling clock for use during normal operations according to the plurality of calculated SOD values. In this way, the display controller 200 ensures optimal effectiveness of ADC 202 sampling operations.

Figure 2:
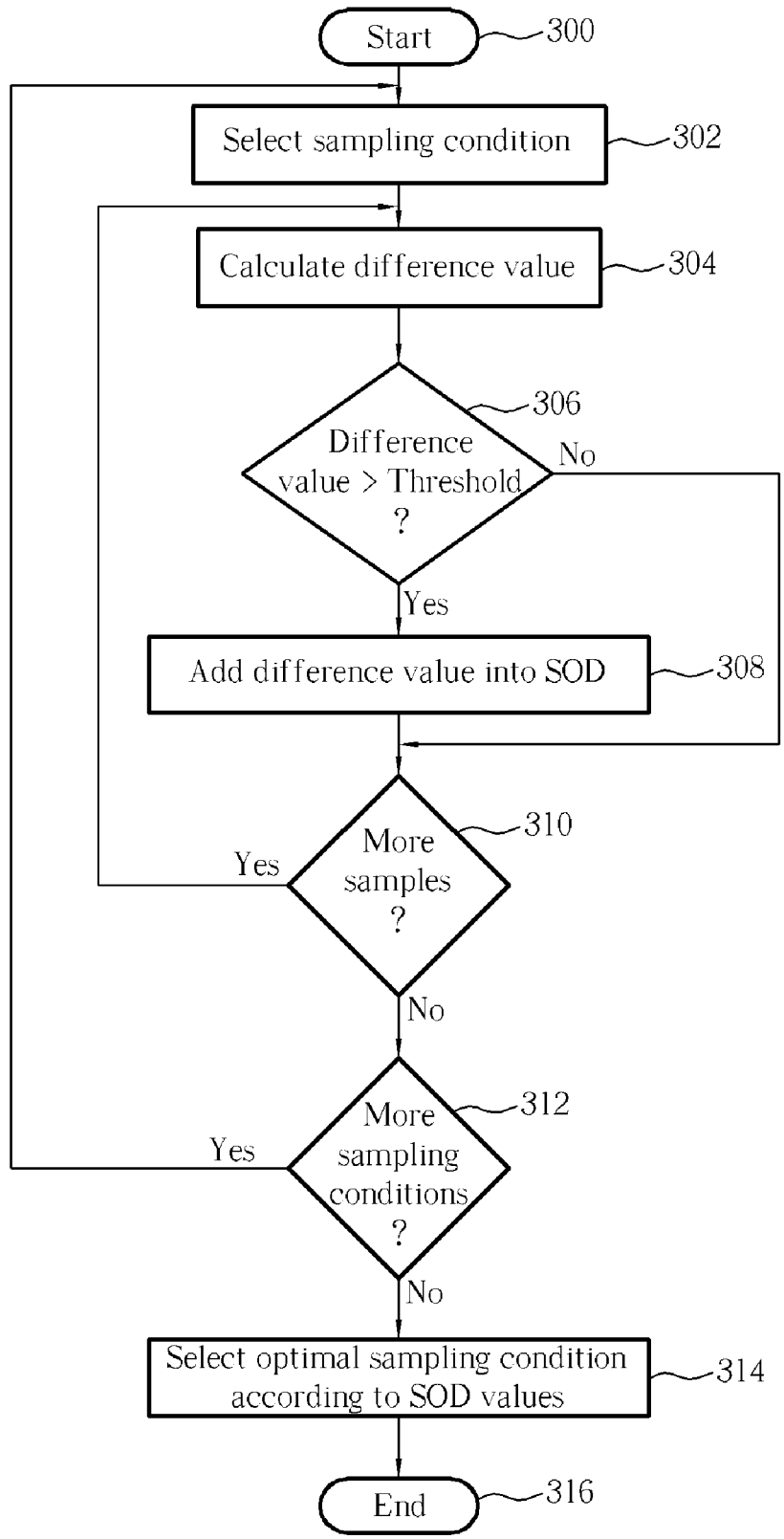
FIG. 2 shows a flowchart describing operations performed in the adjusting mode of the display controller of FIG. 1 to adjust the sampling condition of the ADC according to an exemplary embodiment of the present invention.

FIG. 2 shows a flowchart describing operations performed in the adjusting mode of the display controller 200 to adjust the sampling condition of the ADC 202 according to an exemplary embodiment. In the adjusting mode, the difference accumulator circuit 206 utilizes the selection signal to choose one sampling clock from a plurality of different sampling conditions (e.g., having different sampling phases) generated by the sampling clock generator 204 as the sampling clock of the ADC 202 (step 302). Next, the difference accumulator circuit 206 calculates a difference value between two adjacent samples (i.e., a current sample and a previous sample) for all samples in a duration of the sampled signal (step 304). The size of the calculated difference value (i.e., the absolute value) is checked to determine if it is greater than a first threshold (step 306). If so, the current difference value is added into the SOD value for this sampling condition (step 308). If the size of the calculated difference value is not greater than the first threshold, the current difference value is not added to the SOC value. Next, a check is performed to determine if there are still samples in the duration of the sampled signal, and the above-described steps 304 to 308 are repeated until all samples have been processed in the duration of the sampled signal (step 310). The operations of the above-described steps 302 to 310 are then repeated for different sampling conditions (step 312) to thereby calculate a plurality of corresponding SOD values. Finally, after the corresponding SOD values have been calculated, the difference accumulator circuit 206 accordingly utilizes the selection signal to control the sampling clock provided to the ADC 202 during normal operations according to the SOD values to thereby ensure the optimal ADC 202 sampling result (step 314). In this embodiment, the difference accumulator circuit 206 chooses the sampling condition (i.e., the sampling phase in this embodiment) corresponding to the largest SOD value to generate the sampling clock.

Figure 3:
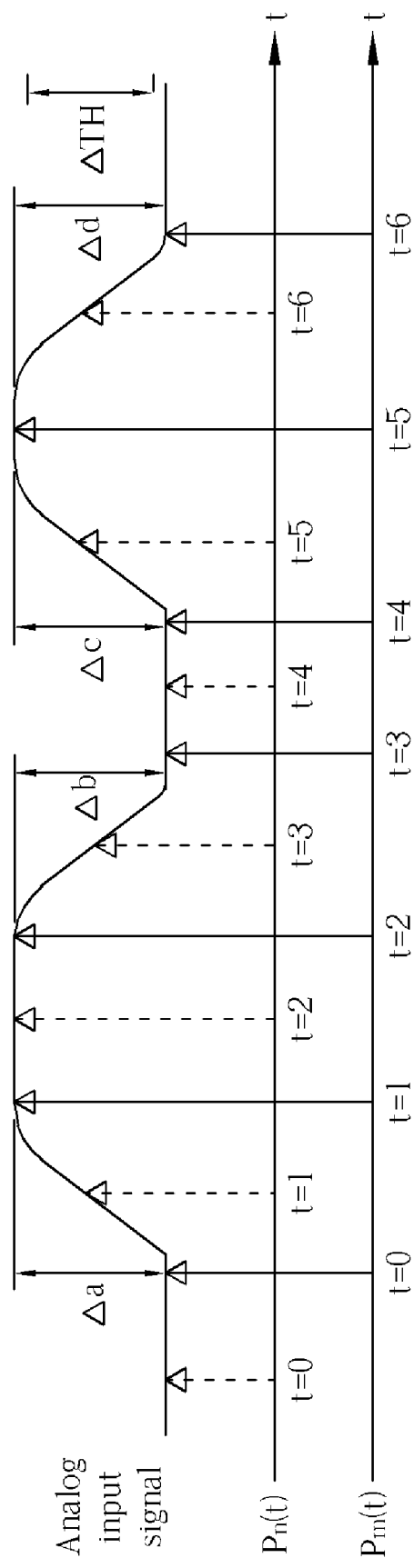
FIG. 3 shows a sampling diagram of an ADC operating under two different sampling conditions when sampling an analog signal according to an embodiment of the present invention.

Because the method of calculating the SOD value described in FIG. 2 involves deciding whether the samples comprise an edge, the method of FIG. 2 is hereafter referred to as edge mode SOD value calculation. FIG. 3 shows a sampling diagram of an ADC operating under two different sampling conditions when sampling an analog signal. When utilizing the above-described method of calculating the SOD value and setting the above described threshold value to an appropriate value (i.e., $\Delta TH$ shown in FIG. 3), the SOD value according to sampling condition Pm(t) is calculated as: $SODe(m)=\Delta a+\Delta b+\Delta c+\Delta d$. Alternatively, the SOD value according to sampling condition Pn(t) is calculated as: $SODe(n)=0$. Therefore, choosing the optimal sampling condition from a plurality of different sampling conditions is easily performed since the method of the above-described embodiment makes the difference between corresponding SOD values become larger for the different sampling conditions.

Figure 4:
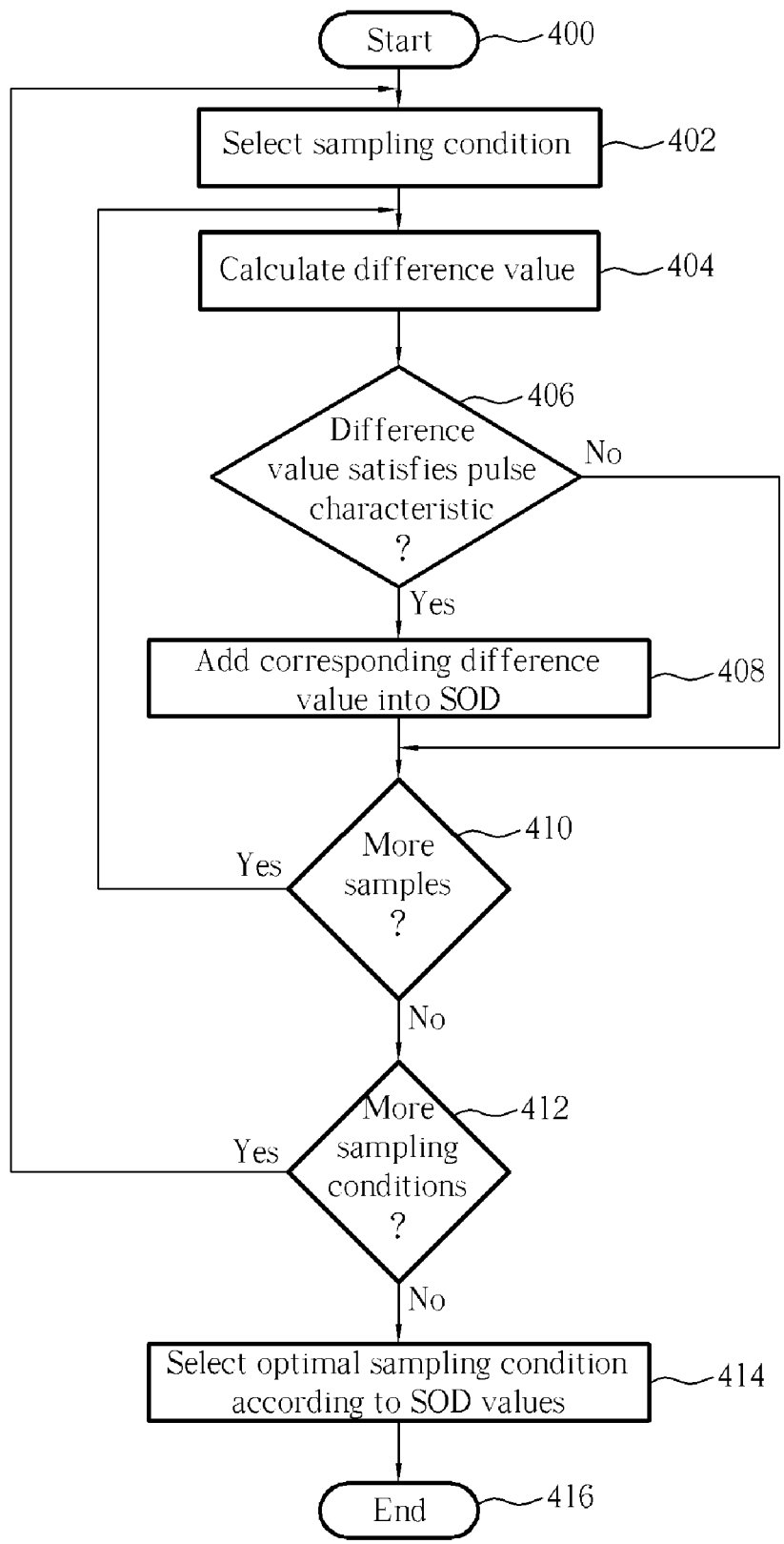
FIG. 4 shows a flowchart describing operations performed in the adjusting mode of the display controller of FIG. 1 to adjust the sampling condition of the ADC according to another exemplary embodiment.

FIG. 4 shows a flowchart describing operations performed in the adjusting mode of the display controller 200 to adjust the sampling condition of the ADC 202 according to another exemplary embodiment. The steps shown in FIG. 4 are similar to those steps shown for the previous embodiment shown in FIG. 2 with differences being located only in steps 406 and 408, which are explained in the following. After calculating the difference value between a current sample and a previous sample at step 404, the difference accumulator circuit 206 next examines the previously calculated plurality of difference values to decide if a signal represented by the difference values satisfies a pulse characteristic (step 406). In this embodiment, when performing step 406, the difference accumulator circuit 206 checks if the size of a difference value between a current sample and a previous sample is greater than a first threshold, and checks if the size of a difference between the previous sample and a sample being prior to the previous sample is greater than a second threshold. Of course, it should be noted that the first and second thresholds could be implemented as the same value. Additionally, the difference accumulator circuit 206 checks if the two difference values have opposite polarity. If the results of the above-described three checks are all affirmative, then the signal is judged to have the pulse characteristic. If the signal is judged to have the pulse characteristic, the difference accumulator circuit 206 adds the above-stated corresponding difference value (in this embodiment, the size of the difference value between the current sample and the previous sample, or the size of the difference value between the previous sample and a sample being prior to the previous sample) into the SOD value (step 408).

Because the method of calculating the SOD value described in FIG. 4 involves deciding whether the samples comprise a pulse, the method of FIG. 4 is hereafter referred to as pulse mode SOD value calculation. As shown in FIG. 3, when utilizing the above-described embodiment to calculate the SOD value and setting the above-described thresholds at a suitable values, the SOD value according to sampling condition Pm(t) is calculated as: $SODp(m)=\Delta c+\Delta d$ (i.e., during time t=4~6 a pulse is formed). And the SOD value according to sampling condition Pn(t) is calculated as: $SODp(n)=0$. Therefore, choosing an optimal sampling condition from a plurality of different sampling conditions is easily since the method of the above described embodiment makes the difference between corresponding SOD values become larger for the different sampling conditions.

As shown above, regardless of whether edge mode SOD value calculation or pulse mode SOD value calculation is used, under different sampling conditions, the corresponding SOD values will always have larger difference values. Furthermore, in another embodiment, the difference accumulator circuit 206 performs a weighted average operation on the SOD values calculated by these two modes to obtain a weighted SOD value: SODw=(We·SODe)+(Wp·SODp), where We and Wp are weighting factors for edge mode and pulse mode SOD value calculation, respectively. For example, in a preferred embodiment, We=1 and Wp=2. Afterwards, selection of the optimal sampling condition is performed according to the weighted SOD value. Utilizing the above-described weighted adjustment, further flexibility of circuit design is provided, and this allows selection of the sampling condition to be even more smoothly performed.

By means of the methods described by the above exemplary embodiments of the present invention, the situation in an ADC that an optimal sampling condition cannot be determined because an incoming analog signal does not have sufficiently large change is overcome. Concerning edge mode, pulse mode, weighted calculation, and the size of the thresholds, these can be decided according to the situation of the signal received by the ADC. As will be understood by a person of ordinary skill in the art after having read the above disclosure, the difference accumulator circuit 206 can also perform other comparisons or operations on the calculated difference values to thereby decide whether to add the difference values into the SOD value. These other methods also conform to the spirit of the present invention and are therefore within in the scope of protection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display controller comprising:
   an analog to digital converter module for receiving an analog input signal and generating a digital sampled signal having a plurality of samples according to a sampling clock;
   a calculating module coupled to the analog to digital converter module for comparing a difference value between two adjacent samples in the digital sampled signal with a first threshold, and when the difference value is greater than the threshold, adding the difference value to a sum of differences value; and
   a sampling clock generator module coupled to the analog to digital converter module and the calculating module for generating the sampling clock according to the sum of differences value calculated by the calculating module.

2. The display controller of claim 1, wherein the calculating module is further for comparing a first threshold value with a first difference value between a current sample and a previous sample from three adjacent samples, comparing a second threshold value with a second difference value between the previous sample and a sample being prior to the previous sample from the three adjacent samples, and adding either the first difference value or the second difference value into the sum of differences value according to results of the comparisons.

3. The display controller of claim 1, wherein the sampling clock generator module is further for choosing a sampling phase from a plurality of sampling phases to thereby generate the sampling clock according to the sum of differences value calculated by the calculating module.

4. The display controller of claim 1, wherein the sampling clock generator module is further for choosing a sampling frequency from a plurality of sampling frequencies to thereby generate the sampling clock according to the sum of differences value calculated by the calculating module.

5. The display controller of claim 1, further comprising a later-stage circuit for receiving the digital sampled signal and performing image processing to thereby generate a driving signal for a display panel.

6. The display controller of claim I, being a liquid crystal display (LCD) controller chip.

7. The display controller of claim 1, being a digital television (DTV) controller chip.

8. An analog to digital converter comprising:
   an analog to digital converter module for receiving an analog input signal and generating a digital sampled signal having a plurality of samples according to a sampling clock;
   a calculating module coupled to the analog to digital converter module for comparing a difference value between two adjacent samples in the digital sampled signal with a first threshold, and when the difference value is greater than the threshold, adding the difference value to a sum of differences value; and
   a sampling clock generator module coupled to the analog to digital converter module and the calculating module for generating the sampling clock according to the sum of differences value calculated by the calculating module.

9. The analog to digital converter of claim 8, wherein the calculating module is further for comparing a first threshold value with a first difference value between a current sample and a previous sample from three adjacent samples, comparing a second threshold value with a second difference value between the previous sample and a sample being prior to the previous sample from the three adjacent samples, and adding either the first difference value or the second difference value into the sum of differences value according to results of the comparisons.

10. The analog to digital converter of claim 8, wherein the sampling clock generator module is further for choosing a sampling phase from a plurality of sampling phases to thereby generate the sampling clock according to the sum of differences value calculated by the calculating module.

11. The analog to digital converter of claim 8, wherein the sampling clock generator module is further for choosing a sampling frequency from a plurality of sampling frequencies to thereby generate the sampling clock according to the sum of differences value calculated by the calculating module.

12. The analog to digital converter of claim 8, being installed in a liquid crystal display (LCD) controller chip.

13. The analog to digital converter of claim 8, being a digital television (DTV) controller chip.

14. A method of adjusting a sampling condition to generate a sampling clock in an analog to digital converter, the method comprising:
   performing an analog to digital conversion on an analog input signal to thereby produce a digital sampled signal having a plurality of samples;
   calculating a difference value between two adjacent samples in the digital sampled signal;
   comparing the difference value with a threshold;
   adding the difference value into a sum of differences value if the difference value is greater than the threshold; and generating the sampling clock for the analog to digital converter according to the sum of differences value.

15. The method of claim 14, further comprising:
comparing a first threshold value with a first difference value between a current sample and a previous sample from three adjacent samples;
comparing a second threshold value with a second difference value between the previous sample and a sample being prior to the previous sample from the three adjacent samples; and
adding either the first difference value or the second difference value into the sum of differences value according to results of the comparisons.

16. The method of claim 14, further comprising:
choosing a sampling phase from a plurality of sampling phases according to the sum of differences value calculated by the calculating module to thereby generate the sampling clock for the analog to digital converter.

17. The method of claim 14, further comprising:
choosing a sampling frequency from a plurality of sampling frequencies according to the sum of differences value calculated by the calculating module to thereby generate the sampling clock for the analog to digital converter.

18. The method of claim 14, being utilized in a liquid crystal display (LCD) controller chip.

19. The method of claim 14, being utilized in a digital television (DTV) controller chip.

20. A display apparatus comprising:
an analog to digital converter module for receiving an analog input signal and generating a digital sampled signal having a plurality of samples according to a sampling clock;
a calculating module coupled to the analog to digital converter module for subjecting a difference value between two adjacent samples in the digital sampled signal to at least one criterion, and when the at least one criterion is met by the difference value, adding the difference value to a sum of differences value; and
a sampling clock generator module coupled to the analog to digital converter module and the calculating module for generating the sampling clock according to the sum of differences value calculated by the calculating module.

21. The display apparatus of claim 20 wherein the at least one criterion comprises determining whether the difference value is greater than a first threshold.

22. The display apparatus of claim 20 is a LCD monitor, a LCD television, or a digital television.

* * * * *